United States Patent [19]

Isaac et al.

[11] Patent Number: 4,483,726

[45] Date of Patent: Nov. 20, 1984

[54] DOUBLE SELF-ALIGNED FABRICATION PROCESS FOR MAKING A BIPOLAR TRANSISTOR STRUCTURE HAVING A SMALL POLYSILICON-TO-EXTRINSIC BASE CONTACT AREA

[75] Inventors: Randall D. Isaac; Tak H. Ning; Paul M. Solomon, all of Yorktown Heights, N.Y.

[73] Assignee: International Business Machines Corporation, Armonk, N.Y.

[21] Appl. No.: 517,155

[22] Filed: Jul. 25, 1983

Related U.S. Application Data

[62] Division of Ser. No. 280,142, Jun. 30, 1981, abandoned.

[51] Int. Cl.³ .......................................... H01L 21/225
[52] U.S. Cl. ..................................... 148/187; 148/1.5; 148/188; 29/578; 357/34
[58] Field of Search ....................... 148/187, 188, 1.5; 29/578; 357/34, 50, 54, 59

[56] References Cited

U.S. PATENT DOCUMENTS

| | | | |
|---|---|---|---|
| 3,676,230 | 7/1972 | Rice | 148/188 |
| 4,157,269 | 6/1979 | Ning et al. | 357/34 |
| 4,319,932 | 3/1982 | Jambotkar | 148/187 |
| 4,358,326 | 11/1982 | Doo | 148/1.5 |

Primary Examiner—Aaron Weisstuch
Assistant Examiner—Hunter L. Auyang
Attorney, Agent, or Firm—John J. Goodwin

[57] ABSTRACT

A bipolar transistor device is disclosed having a structure wherein a layer of insulating material extends over and covers the structure substrate up to the region of the extrinsic base around the emitter. A very small area conductive base contact is provided to the extrinsic base, and a protective wall of insulating material is located on the sidewall of the base contact to isolate it from the emitter contact. This structure is made possible by a fabrication process incorporating a double-self-alignment technique wherein the base is self-aligned to a window in the insulating material and the emitter is self-aligned to the base.

6 Claims, 7 Drawing Figures

DOUBLE SELF-ALIGNED FABRICATION PROCESS FOR MAKING A BIPOLAR TRANSISTOR STRUCTURE HAVING A SMALL POLYSILICON-TO-EXTRINSIC BASE CONTACT AREA

This is a division of U.S. patent application Ser. No. 280,142 filed June 30, 1981 which has now been abandoned.

DESCRIPTION

1. Technical Field

This invention relates to an oxide isolated bipolar transistor structure with a small polysilicon to extrinsic base contact area, fabricated by a double self-aligned process wherein the base is self-aligned to an oxide window and the emitter is self-aligned to the base.

2. Background Art

U.S. Pat. No. 4,157,269 issued June 5, 1979 to Ning, et al entitled Utilizying Polysilicon Diffusion Sources and Special Masking Techniques describes a process for fabricating a bipolar transistor using a single self-aligned process wherein the emitter is self-aligned to the extrinsic base contacts. The polysilicon contact to the extrinsic base region, being defined by the relative alignment of two mask levels, is much larger than that achieved by the present invention.

U.S. Pat. No. 3,398,355 issued Aug. 20, 1978 to Dill, Jr., entitled Transistor Structure with an Emitter Region Epitaxially Grown over the Base Region shows a transistor structure with a relatively large base contact area, and is cited only because the base contact includes an insulating layer thereover. The base contact is aluminum and the insulating layer is aluminum oxide film grown on the aluminum layer to maintain it stable.

BRIEF DESCRIPTION OF THE DRAWINGS

FIGS. 2-1 through 2-6 are illustrations of the cross-section of the bipolar transistor of FIG. 1 during selected steps in a double-self-aligned fabrication process according to the present invention.

DISCLOSURE OF THE INVENTION

The present invention provides an improved bipolar transistor structure and a preferred double-self-aligned process for fabricating such structure.

Figure 1:
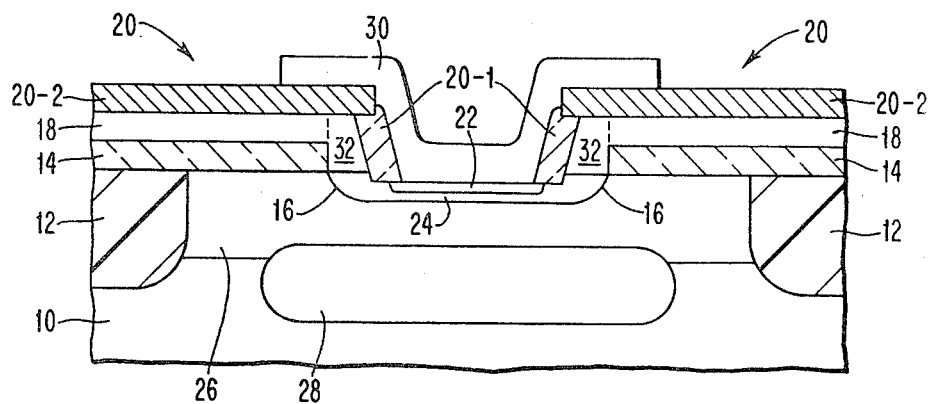
FIG. 1 is a schematic illustration of a cross-section view of a bipolar transistor structure following the principles of the present invention.

FIG. 1 illustrates a cross-sectional view of an embodiment of a bipolar transistor structure following the principles of the present invention.

The structure of FIG. 1, resulting from a double-self-alignment fabrication process to be described, includes a semiconductor substrate 10 with recessed oxide isolation regions 12. A layer 14 of insulation material such as silicon dioxide extends on the surface of substrate 10 over and past the edges of the recessed oxide regions 12 toward the center of the device region and includes a window opening for the emitter region. The insulation layer 14 extends to the edge of the extrinsic base 16. A layer 18 of conductive contact material such as p+ polysilicon is disposed over the insulation layer 14 and extends over the edge thereof and vertically downward to contact the extrinsic base 16. In practice, the extrinsic base 16 is formed by driving in dopants from polysilicon layer 18, therefore polysilicon layer 18 need only be doped p+ in the region 32 over the extrinsic base region rather than throughout the entire layer 18, which needs only to be composed of conductive material. A second insulation layer 20, such as a combination of silicon dioxide 20-1 and aluminum ioxide 20-2 is disposed on and extends over the inner edge of contact layer 18 and vertically downward to the surface of substrate 10 to isolate the emitter region from the base contact 18. Alternatively, layer 20 may be composed entirely of one single suitable insulating material.

The remaining elements of the bipolar device include the emitter 22, the intrinsic base 24, an n-epi collector 26, an n+ subcollector 28, and an emitter contact 30 composed, for example, of n+ polysilicon.

It should be noted that the base contact area is very small, of sub-micron dimensions, and is disposed between insulating layer 14 and the insulating layer 20, which also serves to isolate the base contact 18 from the emitter contact 30. The reduced area of the extrinsic base 16 reduces the parasitic capacitance, which results in both high speed operation and high packing density for integrated circuit applications. Also, the extrinsic base is self-aligned to the vertical edge of oxide 14 and the emitter is self-aligned to the extrinsic base, as a result of a fabrication process described hereinbelow.

A process for fabricating the bipolar device illustrated in FIG. 1 is shown in FIGS. 2-1 through 2-6. The main feature of the process is to first employ an oxide step to define a self-aligned rim of conductive material which serves as the base contacts, then to use this conductive rim to establish an oxide isolated emitter.

Figures 1, 2:
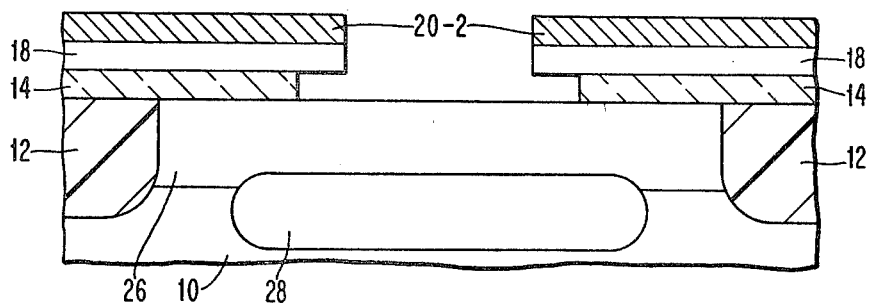
Figure 2:
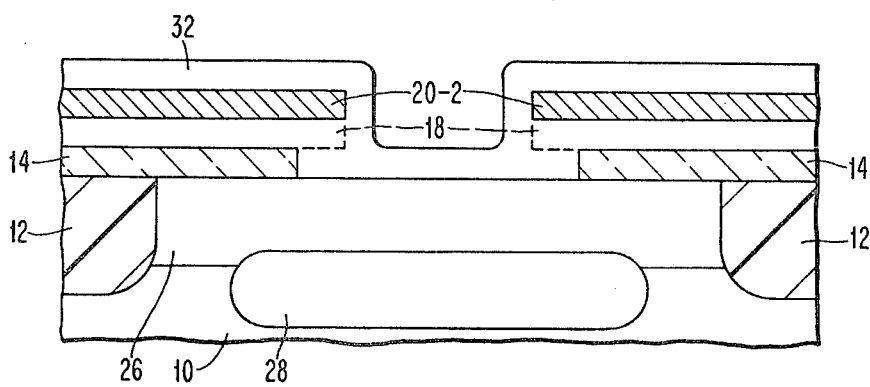

More particularly, in FIG. 2-1, an insulation layer 14 (i.e., silicon-dioxide) is disposed on a silicon substrate 10 having recessed oxide isolation regions 12, an epi collector 26 and an n+ subcollector 28, disposed therein by conventional techniques. A layer 18 of conductive material (i.e., p+ polysilicon, or refractory metal) is deposited over layer 14 and a second insulation layer 20 is deposited over layer 18. Insulation layer 20 must have the properties of being a good reactive ion etching (RIE) mask for polysilicon and be a good mask for silicon oxidation. Aluminum oxide ($Al_2O_3$) or silicon dioxide ($SiO_2$) is a suitable material for layer 20, however, other materials or combinations of materials are possible.

A hole or window is then etched in layer 20 (i.e., using $H_3PO_4$ for $Al_2O_3$) and layer 18, and then part of layer 14 is etched using reactive ion etching. The remainder of layer 14 is then etched by chemical etching so that part of layer 14 is undercut to provide the structure illustrated in FIG. 2-1. The chemical etching which provides the undercut may be optional, and the structure may be fabricated without such undercut.

Next, a p+ polysilicon layer 32 is deposited over the structure of FIG. 2-1 as shown in FIG. 2-2. Due to the conformal nature of the deposition, the polysilicon layer 32 will also deposit in the undercut region. This forms a protective bridge connecting the first conductive layer 18 with substrate 10.

Figures 2, 3:
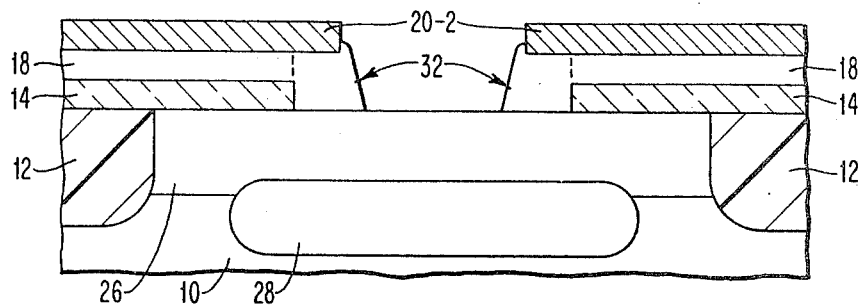

The polysilicon layer 32 is etched using reactive ion etching in order to remove the polysilicon from the exposed horizontal surfaces, and partially from the sidewall of the aluminum oxide layer 20-2, leaving a vertical connective bridge from layer 18 to the substrate 10 as illustrated in FIG. 2-3.

Figures 2, 3, 4:
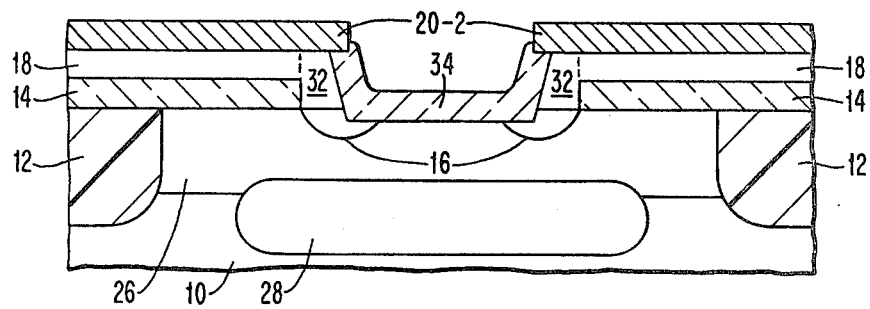
Figures 2, 3, 4, 5:
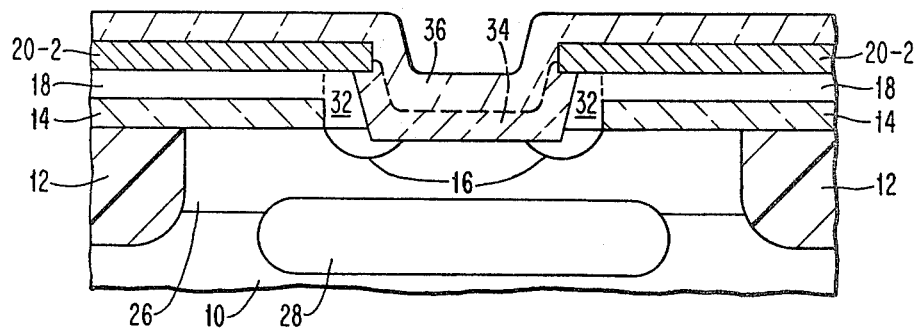
Figures 2, 3, 4, 5, 6:
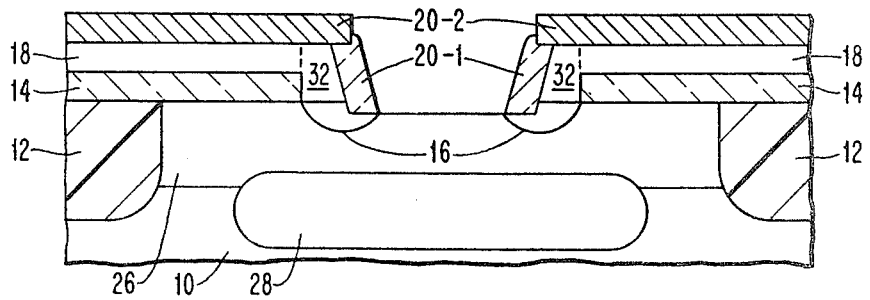

In the next step the exposed silicon substrate 10 and polysilicon 32 is oxidized as well as any residual polysilicon on the sidewalls of the aluminum dioxide layer 20-2 to provide layer 34 as shown in FIG. 2-4. During this step, p+ impurities such as boron is driven into substrate 10 from the remaining p+ polysilicon sidewall remainder of layer 32, thereby forming the extrinsic base regions 16, as also shown in FIG. 2-4. If necessary, an additional annealing treatment can be applied to drive the boron in deeper.

Additional silicon dioxide 36 is now chemically vapor deposited over the structure to thicken the oxide layer 34, as illustrated in FIG. 2-5.

The horizontal portions of silicon dioxide layers 34 and 36 are removed by directional reactive ion etching, leaving silicon dioxide sidewalls 20-1 on the sidewalls of polysilicon layer 32. This leaves the emitter region of substrate 10 exposed.

It is important to note that the polysilicon base contacts 32 and extrinsic base 16 are self-aligned to the window formed by the silicon dioxide sidewalls 20-1. The window serves as the emitter opening and therefore the emitter will be self-aligned to the extrinsic base 16 as shown in FIG. 2-6.

The remainder of the device fabrication process cosists of conventional steps. An intrinsic base 24 is formed by boron diffusion or implantation through the window formed by the oxide sidewalls 20-1, and an n+ emitter 22 is implanted (i.e., arsenic). An n+ polysilicon emitter 30 contact is then formed by depositing a layer of arsenic doped polysilicon and masking and etching to produce the structure illustrated in FIG. 1. Alternatively, the emitter contact 30 can be conventional metallurgy. One skilled in the art will appreciate that the base may be implanted before the emitter or that the emitter may be implanted before the base.

The above described fabrication process for FIGS. 2-1 through 2-6, and the resultant structure of FIG. 1 provides an npn device. However, using complimentary material of opposite conductivity a pnp device having a p+ doped emitter, an n+ doped extrinsic base, and a p type collector may be provided by following the same fabrication steps.

What has been described is a unique bipolar transistor device having a structure wherein a layer of insulating material extends over the device substrate up to the extrinsic base around the emitter region. A very small area conductive base contact is provided to the extrinsic base, and a protective sidewall of insulating material is located on the sidewall of the base contact to isolate it from the emitter contact. This unique structure is made possible by a fabrication process incorporating a double self-alignment technique.

While the invention has been particularly shown and described with reference to the preferred embodiment thereof, it will be understood by those skilled in the art that the foregoing and other changes in form and details may be made therein without departing from the spirit and scope of the invention.

Having thus described my invention, what we claim as new, and desire to secure by Letters Patent is:

1. A method for fabricating a bipolar transistor structure comprising the steps of:
    A. providing a substrate composed a first conductivity type semiconductor material and including a region of insulating material recessed therein and surrounding a central device region, a region of epitaxial material over said substrate and within said surrounding recessed insulating material to form a collector and a second conductivity type subcollector region in said substrate below said epitaxial collector and said central device region,
    B. depositing a first layer of electrically insulating material over the surface of said substrate,
    C. depositing a first layer of electrically conductive polysilicon over said first layer of electrically insulating material,
    D. depositing a second layer of electrically insulating material over said first layer of electrically conductive polysilicon deposited in step C,
    E. etching a vertical hole through said second layer of insulating material, said layer of conductive material and said first layer of insulating material over said central device region to expose the surface of said substrate to form a device region opening in said structure, said first and second layers of insulating material and said layer of conductive material extending within said region surrounded by said recessed insulating material,
    F. depositing a second layer of electrically conductive first conductivity type doped polysilicon over said structure, including over the sidewalls of said vertical hole and over said device region opening, said electrically conductive doped polysilicon over said sidewalls of said vertical hole being in contact with said first layer of electrically conductive polysilicon deposited in step C,
    G. etching away horizontal portions of said second layer of electrically conductive polysilicon to leave remaining vertical portions of said second layer of electrically conductive polysilicon on said sidewalls of said vertical hole to form a vertical region of doped electrically conductive polysilicon between said first layer of electrically conductive polysilicon and the surface of said substrate,
    H. driving in first conductivity type impurities from said remaining second layer of doped, electrically conductive polysilicon region of step G into said surface of said substrate to form an extrinsic base region having a width substantially the same as said doped, electrically conductive polysilicon region,
    I. oxidizing said exposed surface of said substrate provided in step E and the sidewall of said vertical region of electrically conductive polysilicon formed in step G such that said vertical region has a width less than said extrinsic base region,
    J. depositng a layer of oxider over said oxide formed in step I,
    K. vertically etching said oxide layer formed in step J to remove the horizontal portion thereof to expose the surface of said substrate in said device region and said surface of said second insulting layer formed in step D to leave a remaining oxide sidewall over said vertical region of electrically conductive polysilicon formed in step G,
    L. forming an intrinsic base region by introducing impurities through the hole formed in step E and bounded by the oxide sidewall formed in step K, said base region thereby being aligned with said oxide sidewall,
    M. implanting a second conductivity type emitter electrode in said device region, said emitter electrode being aligned with said oxide sidewall formed in step K and and thereby also aligned with said base region formed in step L.

2. A method for fabricating a bipolar transistor according to claim 1 wherein said etching step E further includes a horizontally etching the edge of said first layer of insulating material in said vertical hole to provide an undercut region beneath said first layer of electrically conductive polysilicon, and wherein said second layer of electrically conductive doped polysilicon deposited in step F fills in said undercut region.

3. A method for fabricating a bipolar transistor according to claim 1 wherein said first layer of insulating material deposited in step B is composed of aluminum oxide.

4. A method for fabricating a bipolar transistor according to claim 1 wherein said substrate provided in step A is composed of silicon and said insulating material of step A, said second layer of electrically insulating material of step D and said oxide of steps I and J are composed of silicon dioxide.

5. A method for fabricating a bipolar transistor according to claim 1 wherein said substrate provided in step A is composed of p type conductivity silicon, said base region formed in steps H and L are doped with p type impurities said subcollector region provided in step A is of n type impurities, and said emitter electrode formed in step M is implanted with n type impurities to provide an npn bipolar transistor.

6. A method for fabricating a bipolar transistor according to claim 1 wherein said substrate provided in step A is composd of n type conductivity silicon, said base regions forhed in steps H and L are doped with n type impurities, said subcollector region provided in step A is of p type impurities, and said emitter electrode formed in step M is implanted with p type impurities to provide a pnp bipolar transistor.

* * * * *